(12) United States Patent
Masaki

(10) Patent No.: US 8,006,154 B2
(45) Date of Patent: Aug. 23, 2011

(54) SEMICONDUCTOR INTEGRATED CIRCUIT AND METHOD FOR TESTING SEMICONDUCTOR INTEGRATED CIRCUIT

(75) Inventor: Shunichiro Masaki, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 111 days.

(21) Appl. No.: 12/579,097

(22) Filed: Oct. 14, 2009

(65) Prior Publication Data

US 2010/0097102 A1 Apr. 22, 2010

(30) Foreign Application Priority Data

Oct. 16, 2008 (JP) ................... 2008-267419

(51) Int. Cl.
*G01R 31/28* (2006.01)
(52) U.S. Cl. .......... 714/736; 714/744; 714/37; 714/709; 714/715; 714/723; 713/500; 713/501; 375/130; 375/224; 375/226; 375/228; 332/128; 327/164; 327/172; 702/108; 702/117; 324/76.52
(58) Field of Classification Search .................. None
See application file for complete search history.

(56) References Cited

U.S. PATENT DOCUMENTS

| 5,631,920 | A | 5/1997 | Hardin | |
|---|---|---|---|---|
| 6,292,507 | B1* | 9/2001 | Hardin et al. | 375/130 |
| 6,404,834 | B1* | 6/2002 | Hardin et al. | 375/376 |
| 7,363,563 | B1* | 4/2008 | Hissen et al. | 714/733 |
| 7,437,590 | B2* | 10/2008 | Decker et al. | 713/500 |
| 7,759,926 | B2* | 7/2010 | Nikolov et al. | 324/76.52 |
| 2006/0268971 | A1* | 11/2006 | Watabe | 375/226 |
| 2008/0172195 | A1* | 7/2008 | Nakadaira | 702/72 |
| 2009/0179678 | A1* | 7/2009 | Hardin et al. | 327/165 |

FOREIGN PATENT DOCUMENTS

JP        09-098152 A        4/1997

* cited by examiner

*Primary Examiner* — John P Trimmings
(74) *Attorney, Agent, or Firm* — Arent Fox LLP

(57) ABSTRACT

A semiconductor integrated circuit includes a clock generator for generating a second clock signal having a frequency that varies over time by using a first clock signal having a fixed frequency, a test circuit for generating a digital signal according to a difference between a first frequency corresponding to the first clock signal and a second frequency corresponding to the second clock signal by a digital logic operation based on the first clock signal and the second clock signal, and a signal path for outputting the digital signal generated by the test circuit.

10 Claims, 14 Drawing Sheets

US 8,006,154 B2

SEMICONDUCTOR INTEGRATED CIRCUIT AND METHOD FOR TESTING SEMICONDUCTOR INTEGRATED CIRCUIT

CROSS-REFERENCE TO RELATED APPLICATIONS

This application is based upon and claims the benefit of priority from the prior Japanese Patent Application No. 2008-267419 filed on Oct. 16, 2008, the entire contents of which are incorporated herein by reference.

BACKGROUND

1. Field of the Invention

The present invention relates to a semiconductor integrated circuit incorporating a spread spectrum clock generator and a method for testing the semiconductor integrated circuit.

2. Description of Related Art

There is a possibility that an electromagnetic wave, generated by a clock signal propagating through a circuit in an electronic device, affects the operation, or the like, of other electronic devices as EMI (Electro-Magnetic Interference) noise. As a method for reducing the EMI noise, Japanese Laid-Open Patent Publication No 9-98152 describes a method by which a peak value is lowered by periodically fluctuating the frequency of a clock used in an electronic device and thereby spreading the frequency spectrum thereof. The greater the fluctuations in the frequency, the higher degree of effectiveness in reducing EMI noise is obtained. However, since the fluctuations in the frequency change into a kind of jitter, too great fluctuations in the frequency cause an operational problem in the circuit. As a result, it is common to set the fluctuation width (modulation width) of the frequency at about a few tenths of a percent to a few percent of the reference frequency.

A circuit for generating the above-described clock signal having a fluctuating frequency is a spread spectrum clock generator (SSCG). The SSCG is sometimes provided as a single LSI (Large-Scale Integrated Circuit) chip, and is sometimes built into a system LSI. When the SSCG is built into the system LSI, as part of the test conducted at the time of shipment of the LSI, it is necessary to test to see whether or not a clock signal generated by the built-in SSCG is appropriately modulated. To do this, it is common to extract the clock signal outputted from the SSCG to the outside of the LSI via a signal line, and check the spectrum by an analog tester. However, the problem is that the measurement made by the analog tester takes time to conduct a test. Moreover, since the clock signal is affected by noise on the signal line used for extracting the clock signal to the outside of the LSI or on the testing board, it becomes sometimes difficult to measure frequency fluctuations as small as about a few tenths of a percent to a few percent.

Furthermore, the tester used for a test of a system LSI is generally a digital tester, and a test using an analog tester is separately performed in addition to a test using the digital tester, which reduces test efficiency. However, to conduct a test on a SSCG by using the digital tester, it is necessary to operate the digital tester at a frequency which is 100 to 1000 times the reference frequency of the SSCG to measure frequency fluctuations as small as about a few tenths to a few percent. It is practically impossible to operate the digital tester at such a fast frequency.

SUMMARY

According to an aspect of the embodiment, a semiconductor integrated circuit includes a clock generator for generating a second clock signal having a frequency that varies over time by using, as an input, a first clock signal having a fixed frequency, a test circuit for generating a digital signal according to a difference between a first frequency corresponding to the first clock signal and a second frequency corresponding to the second clock signal by a digital logic operation based on the first clock signal and the second clock signal, and a signal path for outputting the digital signal generated by the test circuit.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DETAILED DESCRIPTION OF PREFERRED EMBODIMENTS

Hereinafter, an embodiment of the invention will be described in detail by using the accompanying drawings.

Figure 1:
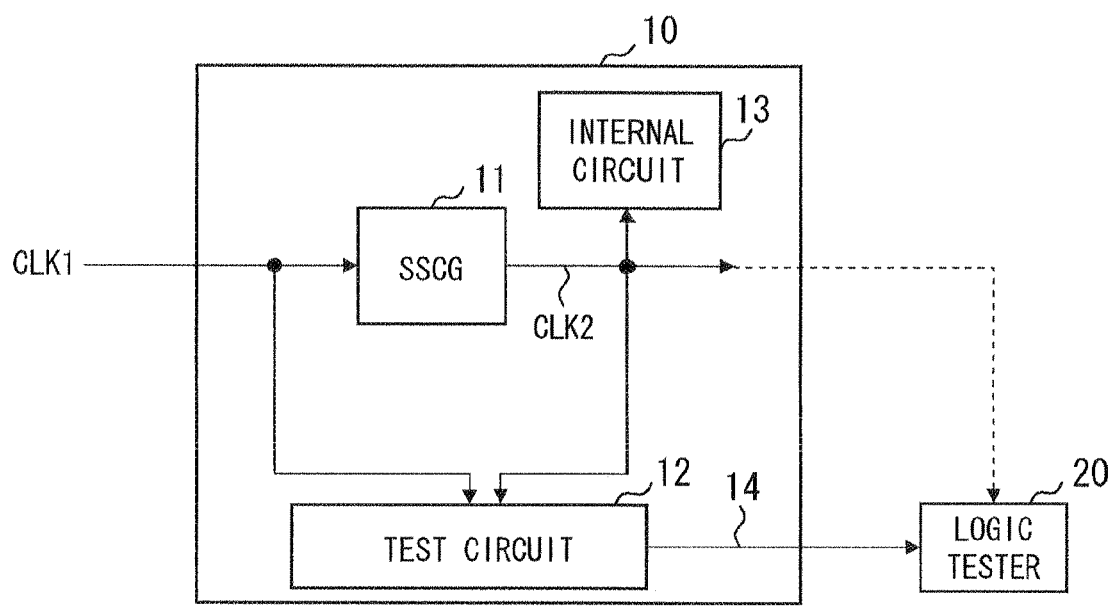
FIG. 1 is a diagram of an example of the configuration of a semiconductor integrated circuit incorporating a spread spectrum clock generator.

FIG. 1 is a diagram of an example of the configuration of a semiconductor integrated circuit incorporating a spread spectrum clock generator. A semiconductor integrated circuit 10 of FIG. 1 is an LSI chip, and includes a spread spectrum clock generator (SSCG) 11, a test circuit 12, an internal circuit 13, and a signal path 14. The spread spectrum clock generator 11 generates a clock signal CLK2 having a frequency that varies over time by using, as an input, a clock signal CLK1 having a fixed frequency.

Here, the frequency of the clock signal CLK1 serves as a reference frequency, and the frequency of the clock signal CLK2 may fluctuate by setting the reference frequency as a center of fluctuations, for example. Alternatively, the frequency of the clock signal CLK2 may fluctuate by setting the reference frequency as an upper limit of fluctuations, for example. Further, the frequency of the clock signal CLK2 may fluctuate by setting the reference frequency as a lower limit of fluctuations, for example. The internal circuit 13 is a circuit operating in synchronism with the clock signal CLK2 generated by the spread spectrum clock generator 11, and may include a CPU, a memory, etc., for example.

The test circuit 12 generates a digital signal according to a difference between a first frequency corresponding to the clock signal CLK1 and a second frequency corresponding to the clock signal CLK2 by a digital logic operation based on the clock signal CLK1 and the clock signal CLK2. The digital signal generated by the test circuit 12 is outputted to the outside of a chip of the semiconductor integrated circuit 10 via the signal path 14, and is fed to a logic tester 20. Moreover, the clock signal CLK2 generated by the spread spectrum clock generator 11 may also be outputted to the outside and fed to the logic tester 20 as indicated by a dotted line.

The digital signal generated by the test circuit 12 may be a binary signal or a plurality of binary signals. For example, the digital signal may be a digital signal expressing a difference between the first frequency, which is the frequency of the clock signal CLK1, and the second frequency, which is the frequency of the clock signal CLK2, as a digital value composed of a plurality of bits. However, in view of the circuit size and the signal path 14 for outputting the signal to the outside of the chip, it is preferable that the number of bits be small.

For example, in the case of a 1-bit digital signal, a pulse spacing, a pulse width, or the like, which is a parameter that can express a digital value with 1 bit simply has to correspond to a difference between the first frequency and the second frequency. Here, the pulse spacing or the pulse width simply has to be a pulse spacing or a pulse width which is synchronism with the clock signal CLK1 or the clock signal CLK2 and can be measured in the unit of the cycle thereof.

The external logic tester 20 detects (takes in) the digital signal outputted from the semiconductor integrated circuit 10 by using, as a synchronizing signal, the clock signal CLK2 or the clock signal CLK1 outputted from the semiconductor integrated circuit 10, for example. The logic tester 20 compares the detected digital signal value with an expected value, and judges whether or not the two values agree with each other. Based on the result of this comparison, the logic tester 20 judges whether or not the operation of the spread spectrum clock generator 11 is appropriate, that is, logic tester 20 determines the quality of the spread spectrum clock generator 11.

Depending on the format of the digital signal outputted from the test circuit 12 of the semiconductor integrated circuit 10, it is not necessary for the logic tester 20 to use the clock signal CLK2 or the like as a synchronizing signal. For example, when the pulse spacing (pulse period) of the digital signal corresponds to a difference between the first frequency and the second frequency, the logic tester 20 can measure the period of a pulse of the digital signal. The logic tester 20 compares the measured pulse period with a predetermined period, and can determine the quality of the spread spectrum clock generator 11 based on the result of this comparison.

Figure 2:
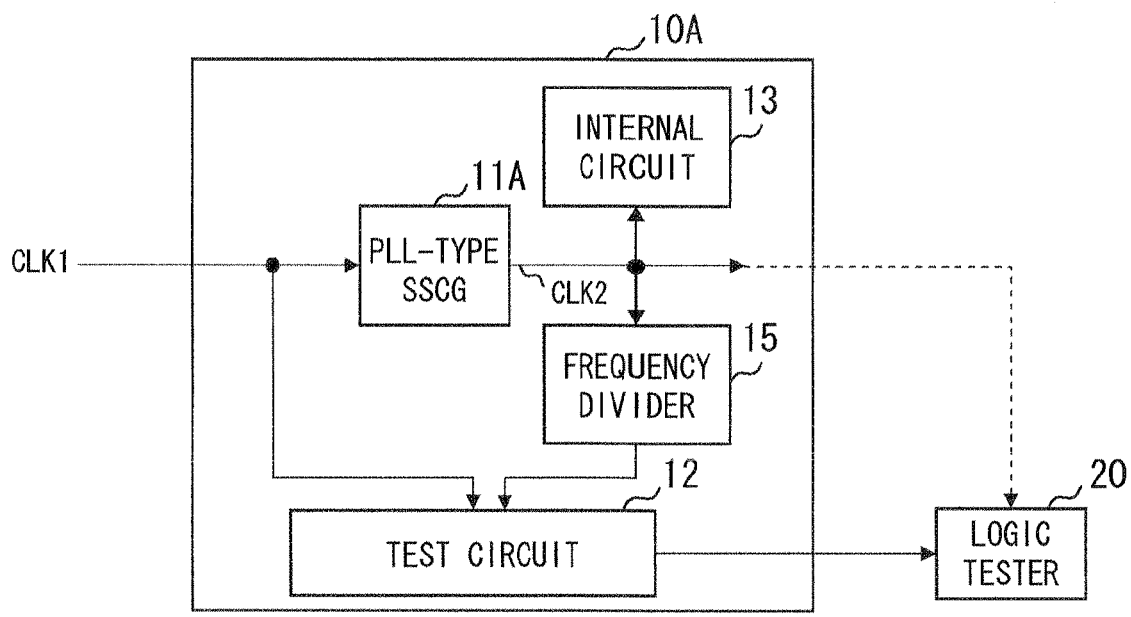
FIG. 2 is a diagram of another example of the configuration of a semiconductor integrated circuit incorporating a spread spectrum clock generator.

FIG. 2 is a diagram of another example of the configuration of a semiconductor integrated circuit incorporating a spread spectrum clock generator. In FIG. 2, such components as are identical to those in FIG. 1 are identified with the same reference numerals and their descriptions will be omitted.

A semiconductor integrated circuit 10A of FIG. 2 is an LSI chip, and includes a PLL (Phase-Locked Loop)-type spread spectrum clock generator 11A, a test circuit 12, an internal circuit 13, a signal path 14, and a frequency divider 15. The PLL-type spread spectrum clock generator 11A generates a clock signal CLK2 having a frequency that varies over time by using, as an input, a clock signal CLK1 having a fixed frequency.

Here, the PLL function of the PLL-type spread spectrum clock generator 11A makes a frequency which is N (N is an integer) times the frequency of the clock signal CLK1 which serves as a reference frequency, and the frequency of the clock signal CLK2 fluctuates by setting the reference frequency as a center of fluctuations, for example. Alternatively, the frequency of the clock signal CLK2 may fluctuate by setting the reference frequency as an upper limit of fluctuations, for example, or the frequency of the clock signal CLK2 may fluctuate by setting the reference frequency as a lower limit of fluctuations, for example.

The frequency divider 15 generates a signal having a frequency which is 1/N times the frequency of the clock signal CLK2 by dividing the frequency of the clock signal CLK2. The test circuit 12 generates a digital signal according to a difference between a first frequency of the clock signal CLK1 and a second frequency (the above-described frequency which is 1/N times the frequency of the clock signal CLK2) corresponding to the clock signal CLK2 by a digital logic operation based on the clock signal CLK1 and the frequency divided signal of the clock signal CLK2. The digital signal generated by the test circuit 12 is outputted to the outside of a chip of the semiconductor integrated circuit 10A via the signal path 14.

Figure 3:
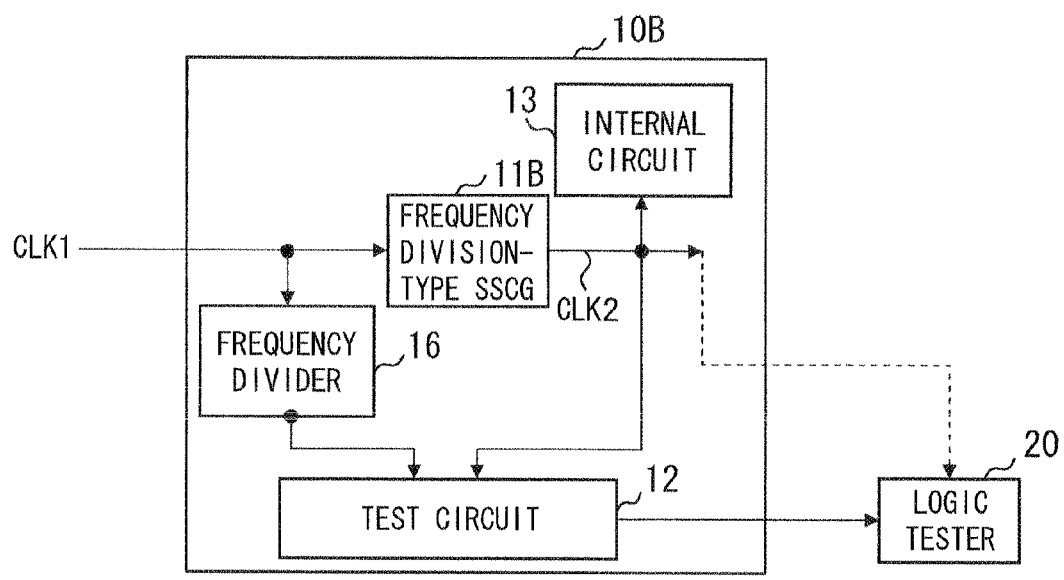
FIG. 3 is a diagram of still another example of the configuration of a semiconductor integrated circuit incorporating a spread spectrum clock generator.

FIG. 3 is a diagram of still another example of the configuration of a semiconductor integrated circuit incorporating a spread spectrum clock generator. In FIG. 3, such components as are identical to those in FIG. 1 are identified with the same reference numerals and their descriptions will be omitted.

A semiconductor integrated circuit 10B of FIG. 3 is an LSI chip, and includes a frequency division spread spectrum clock generator 11B, a test circuit 12, an internal circuit 13, a signal path 14, and a frequency divider 16. The frequency division spread spectrum clock generator 11B generates a clock signal CLK2 having a frequency that varies over time by using, as an input, a clock signal CLK1 having a fixed frequency.

Here, the frequency division function of the frequency division spread spectrum clock generator 11B makes a frequency which is 1/N (N is an integer) times the frequency of the clock signal CLK1 which serves as a reference frequency, and the frequency of the clock signal CLK2 fluctuates by setting the reference frequency as a center of fluctuations, for example. Alternatively, the frequency of the clock signal CLK2 may fluctuate by setting the reference frequency as an upper limit of fluctuations, for example, or the frequency of the clock signal CLK2 may fluctuate by setting the reference frequency as a lower limit of fluctuations, for example.

The frequency divider 16 generates a signal having a frequency which is 1/N times the frequency of the clock signal CLK1 by dividing the frequency of the clock signal CLK1. The test circuit 12 generates a digital signal according to a difference between a first frequency (the above-described frequency which is 1/N times the frequency of the clock signal CLK1) corresponding to the clock signal CLK1 and a second frequency of the clock signal CLK2 by a digital logic operation based on the frequency divided signal of the clock signal CLK1 and the clock signal CLK2. The digital signal generated by the test circuit 12 is outputted to the outside of a chip of the semiconductor integrated circuit 10B via the signal path 14.

Figure 4:
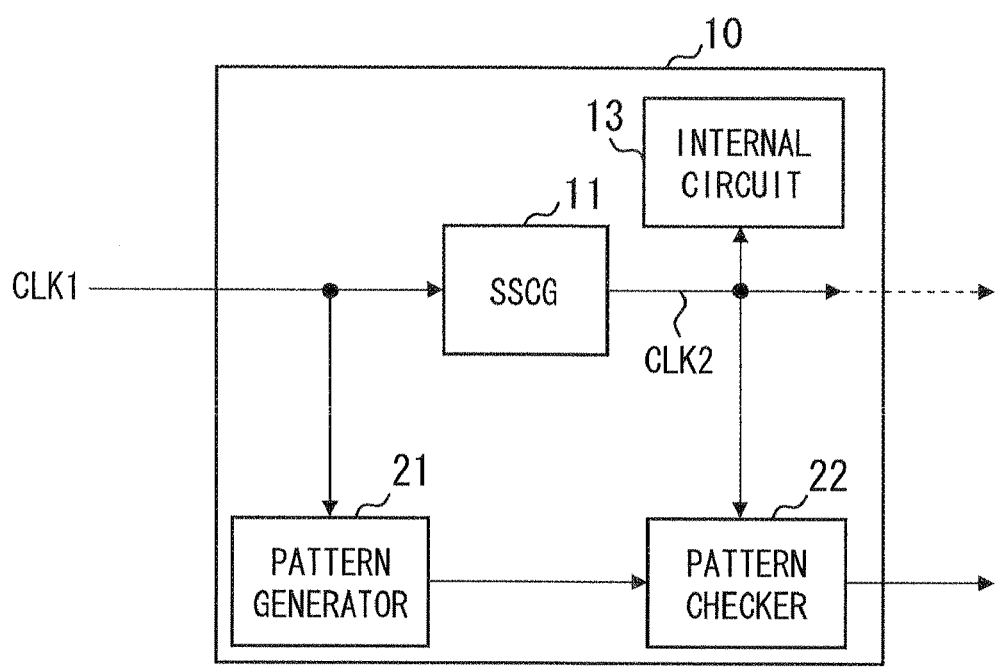
FIG. 4 is a diagram of an example of the configuration of a test circuit 12 of the semiconductor integrated circuit incorporating a spread spectrum clock generator.

FIG. 4 is a diagram of an example of the configuration of the test circuit 12 of the semiconductor integrated circuit incorporating a spread spectrum clock generator. In FIG. 4, the test circuit 12 includes a pattern generator 21 and a pattern checker 22. The pattern generator 21 is a pattern generation circuit operating in synchronism with the first frequency of the clock signal CLK1 and generating a bit sequence. The pattern checker 22 is a pattern detection circuit operating in synchronism with the second frequency of the clock signal CLK2 and judging whether or not the bit sequence agrees with an expected value sequence. The pattern generation circuit can be built as a pseudorandom bit sequence generator, and the pattern detection circuit can be built as a pseudorandom bit sequence detection circuit.

Figure 5:
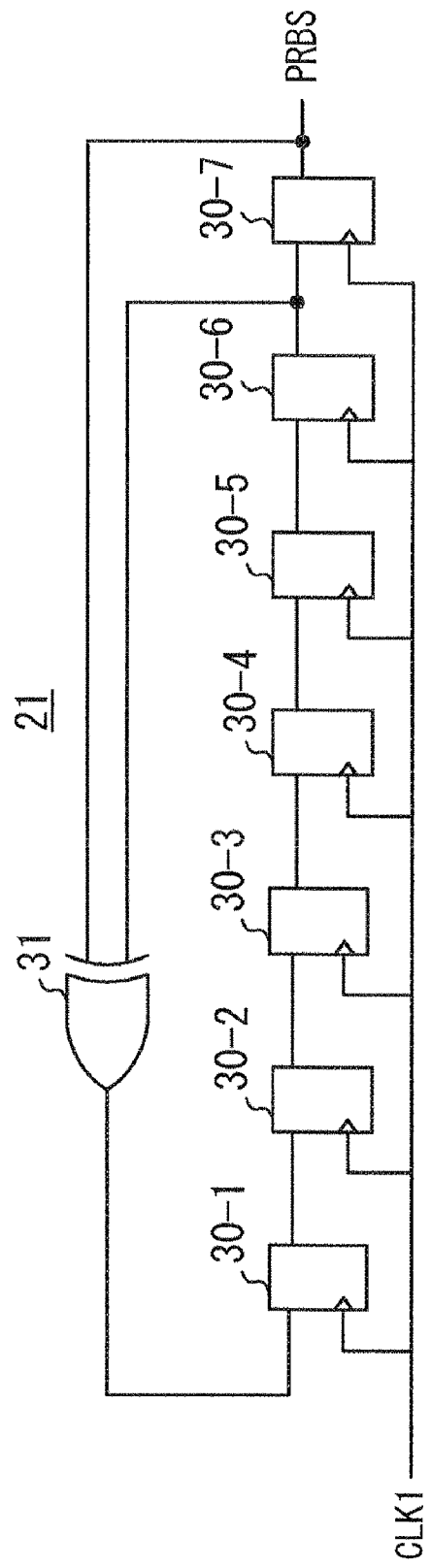
FIG. 5 is a diagram of an example of the configuration of a pattern generator.

FIG. 5 is a diagram of an example of the configuration of the pattern generator 21. The pattern generator 21 of FIG. 5 includes flip-flops 30-1 to 30-7 and an XOR circuit 31. The flip-flops 30-1 to 30-7 may have the preset function of setting the initial value to 1. The flip-flops 30-1 to 30-7 are cascaded in series in such a way that a data output Q of a flip-flop in one stage is connected to a data input of a flip-flop in the following stage, and a clock signal CLK1 is fed to all clock input terminals. As illustrated in FIG. 4, this clock signal CLK1 is the signal fed to the spread spectrum clock generator 11 and the pattern generator 21.

The XOR circuit 31 computes an exclusive OR of an output of the flip-flop 30-6 in the sixth stage and an output of the flip-flop 30-7 in the seventh stage, and outputs the result of computation. The output of the XOR circuit 31 is connected to the data input of the flip-flop 30-1 in the first stage. The output of the XOR circuit 31 becomes a generated pseudorandom bit sequence PRBS.

Figure 6:
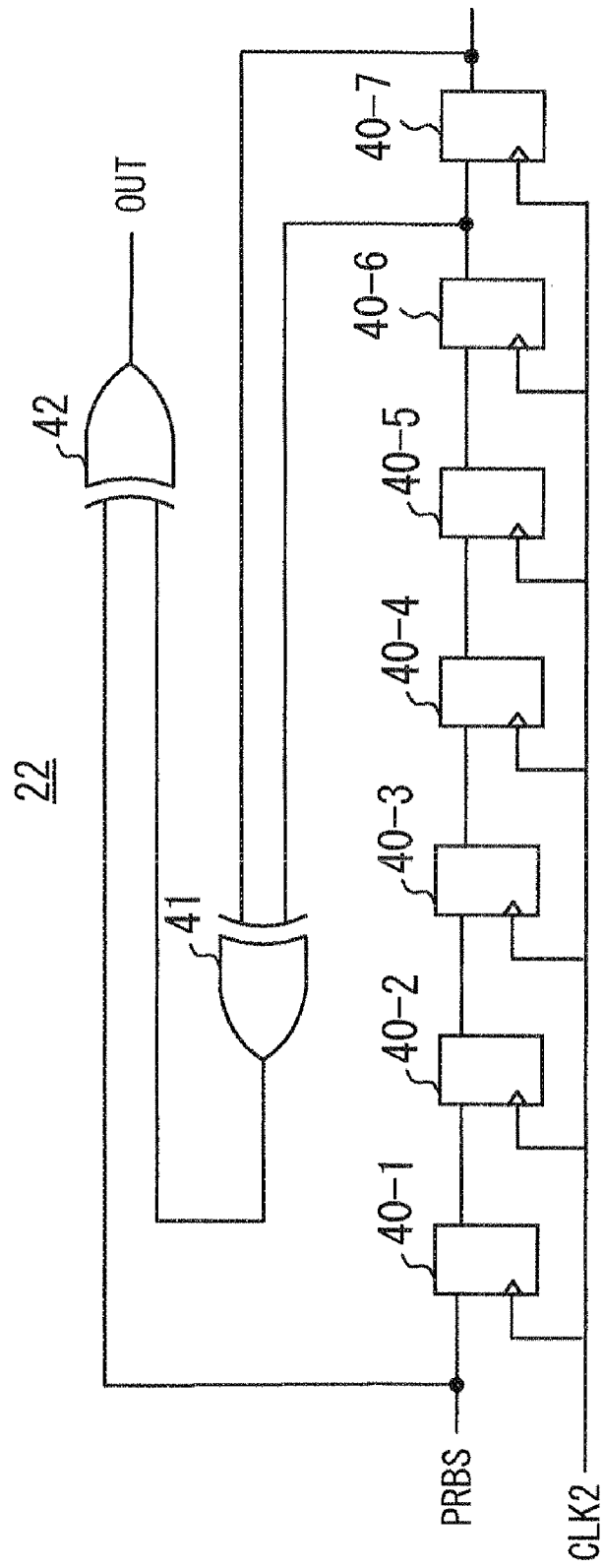
FIG. 6 is a diagram of an example of the configuration of a pattern checker.

FIG. 6 is a diagram of an example of the configuration of the pattern checker 22. The pattern checker 22 illustrated in FIG. 6 is a detector for detecting a pseudorandom bit sequence generated by the pattern generator 21 illustrated in FIG. 5. The pattern checker 22 includes flip-flops 40-1 to 40-7, an XOR circuit 41, and an XOR circuit 42. The flip-flops 40-1 to 40-7 may have the preset function of setting the initial value to 1. The flip-flops 40-1 to 40-7 are cascaded in series in such a way that a data output Q of a flip-flop in one stage is connected to a data input of a flip-flop in the following stage, and a clock signal CLK2 is fed to all clock input terminals.

As illustrated in FIG. 4, this clock signal CLK2 is the signal fed to the pattern checker 22 from the spread spectrum clock generator 11. The pseudorandom bit sequence PRBS generated by the pattern generator 21 of FIG. 5 is fed to the data input of the flip-flop 40-1 in the first stage. The XOR circuit 41 computes an exclusive OR of an output of the flip-flop 40-6 in the sixth stage and an output of the flip-flop 40-7 in the seventh stage, and outputs the result of computation.

For example, let an output value of the XOR circuit 31 be X when a 7-bit stored data of the flip-flops 30-1 to 30-7 of FIG. 5 is a certain bit pattern B. The bit pattern B is sequentially outputted as a pseudorandom bit sequence PRBS in 7 clock cycles. The flip-flops 40-1 to 40-7 of FIG. 6 sequentially store the bit pattern B fed as a pseudorandom bit sequence PRBS in 7 clock cycles. In a state in which the bit pattern B is stored in the flip-flops 40-1 to 40-7, an output value of the XOR circuit 41 is equal to the above-described X.

Moreover, immediately after the last bit of the bit pattern B, the output value X of the XOR circuit 31 of FIG. 5 is fed as a pseudorandom bit sequence PRBS. Therefore, when the output value of the XOR circuit 41 is X, 1 bit of the pseudorandom bit sequence PRBS which is being fed to the pattern checker 22 of the FIG. 6 is also X. That is, two inputs of the XOR circuit 42 have an equal bit value, and an output OUT of the XOR circuit 42 becomes 0.

When the clock signal CLK1 and the clock signal CLK2 have the same frequency, the pattern generator 21 and the pattern checker 22 operate in synchronism with each other, and the output OUT of the XOR circuit 42 is always 0. However, the frequency of the clock signal CLK2 which is an output of the spread spectrum clock generator 11 fluctuates with respect to the frequency of the clock signal CLK1. As described above, when the frequency of the clock signal CLK2 deviates from the frequency of the clock signal CLK1, a slight deviation in each cycle is gradually accumulated. When a deviation corresponding to 1 clock cycle is accumulated after a lapse of a plurality of clock cycles, the two input bits of the XOR circuit 42 become bits in different positions at the time. When bit values of these bits in different positions at the time are different, the output OUT of the XOR circuit 42 becomes 1.

For example, when the frequency of the clock signal CLK2 is ahead of the frequency of the clock signal CLK1 by 1%, the above-described bit deviation appears once every 100 clock cycles. This bit deviation state lasts for a duration of 7 clock cycles. During this duration, 1 randomly appears in the output signal OUT. For example, when seven outputs OUT of 7 clock cycles are ORed by an OR circuit, a pulse signal which becomes "1" once every 100 clock cycles is obtained. All that is needed is to set such a pulse signal as an Error output of the pattern checker 22.

Figure 7:
FIG. 7 is a diagram of an example of a waveform of an Error output which becomes "1" once every 100 clock cycles.

FIG. 7 is a diagram of an example of a waveform of an Error output which becomes "1" once every 100 clock cycles. When the frequency of the clock signal CLK2 deviates from the frequency of the clock signal CLK1 by 1%, as illustrated in FIG. 7, a value of the Error output of the pattern checker 22 becomes "1" once every 100 clock cycles. That is, the Error output of the pattern checker 22 becomes a signal having a pulse period (in this example, 100 cycles) according to a difference (in this example, 1%) between the frequency of the clock signal CLK1 and the frequency of the clock signal CLK2.

Figure 8:
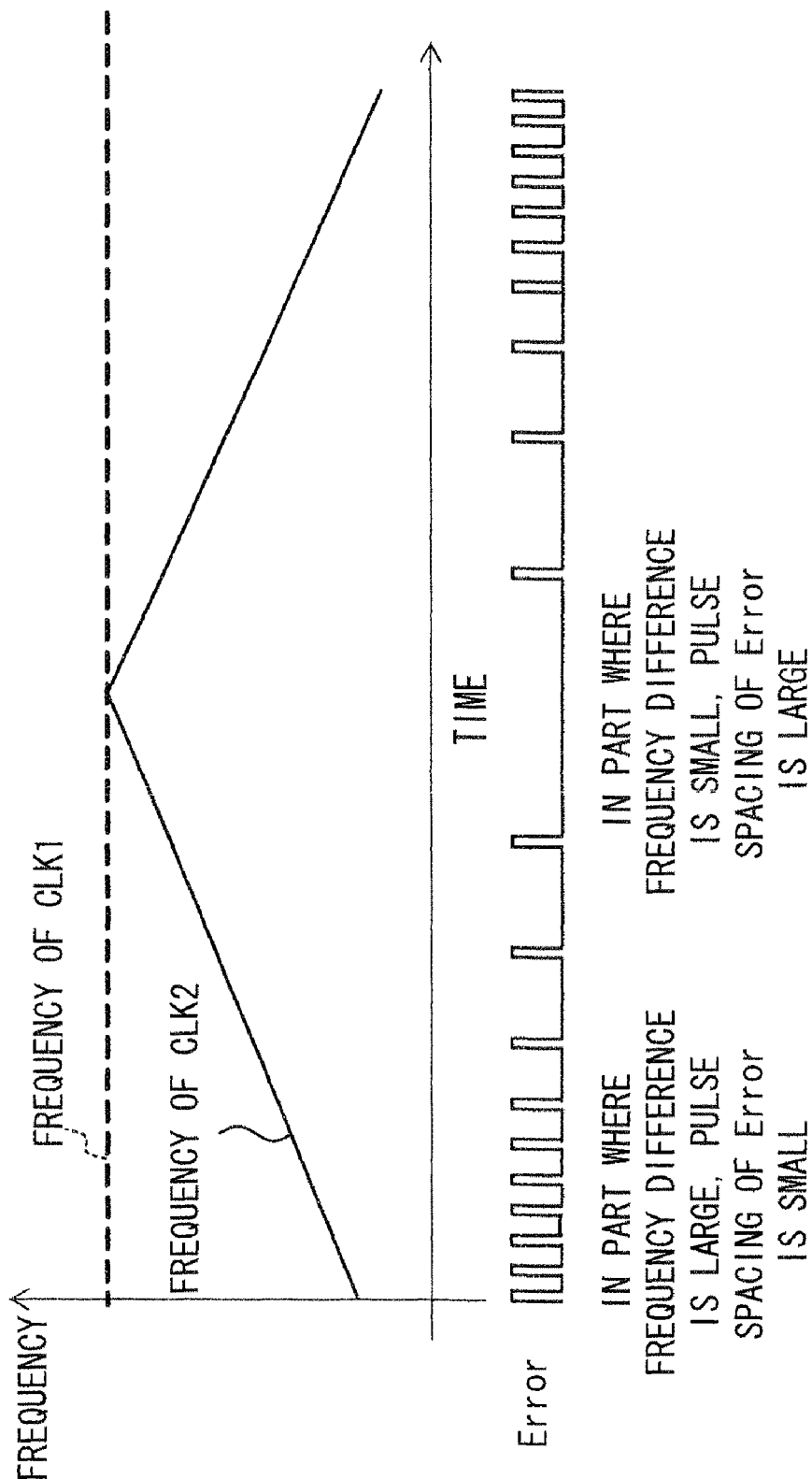
FIG. 8 is a diagram of the relationship between frequency fluctuations and an Error output.

FIG. 8 is a diagram of the relationship between frequency fluctuations and an Error output. In an upper stage of FIG. 8, the fixed frequency of the clock signal CLK1 and the fluctuating frequency of the clock signal CLK2 are illustrated. The vertical axis represents a value of the frequency, and the horizontal axis represents time. The frequency of the clock signal CLK2 repeatedly increases, up to the frequency of the clock signal CLK1, and decreases in a predetermined frequency range.

In a lower stage of FIG. 8, the Error output of the pattern checker 22 is illustrated. As described above, the Error output of the pattern checker 22 is a signal having a pulse spacing according to a difference between the frequency of the clock signal CLK1 and the frequency of the clock signal CLK2. That is, in a part where the frequency difference is large, the pulse spacing of the Error output becomes small; and in a part where the frequency difference is small, the pulse spacing of the Error output becomes large. In response to the repeated increase and decrease of the frequency of the clock signal CLK2, the pulse spacing of the Error output also increases and decreases repeatedly.

Figure 9:
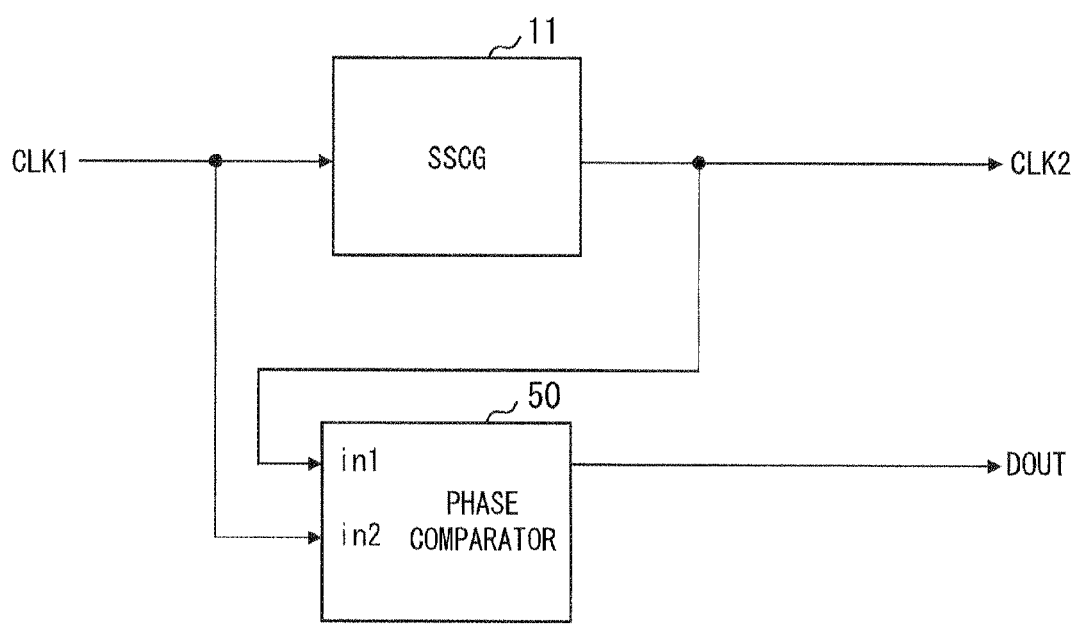
FIG. 9 is a diagram of another example of the configuration of a test circuit.

FIG. 9 is a diagram of another example of the configuration of the test circuit 12. In FIG. 9, the test circuit 12 includes a phase comparator 50. The phase comparator 50 compares the phase of the clock signal CLK1 with the phase of the clock signal CLK2. The phase comparator 50 may generate, as an output signal DOUT, a signal indicating which phase leads the other according to the result of phase comparison.

Figure 10:
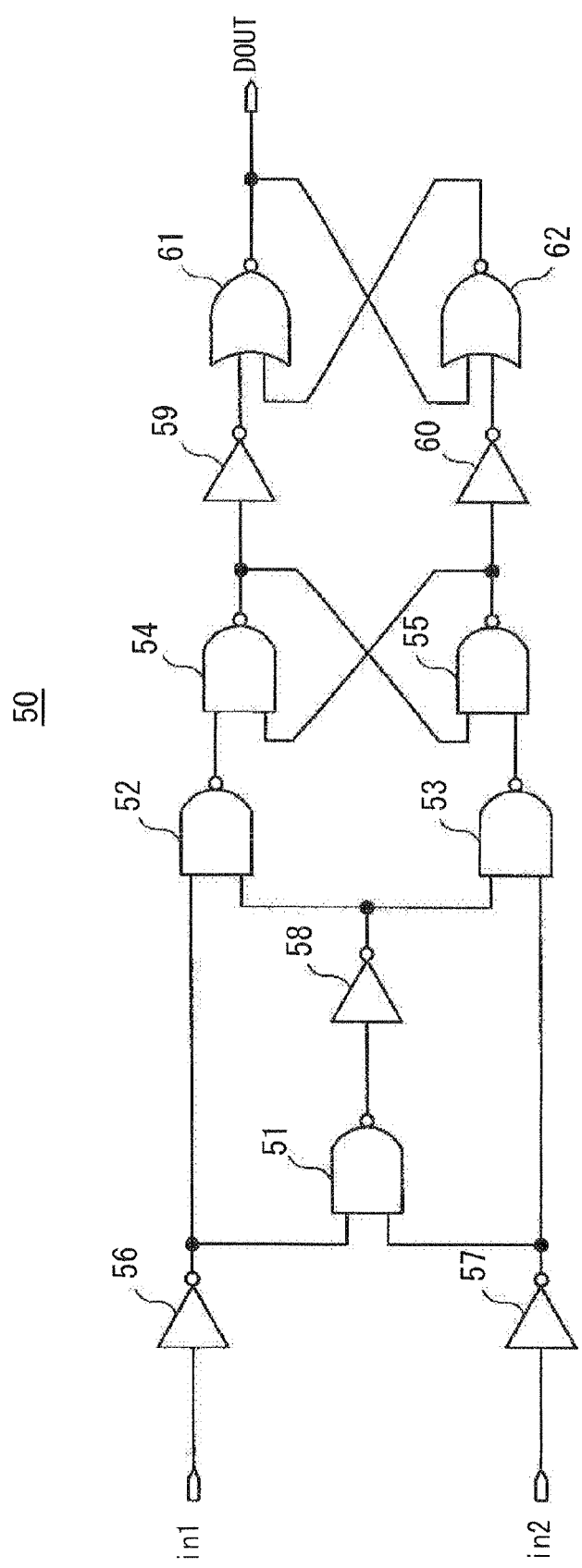
FIG. 10 is a diagram of an example of the configuration of a phase comparator.

FIG. 10 is a diagram of an example of the configuration of the phase comparator 50. The phase comparator 50 outputs a signal having a signal level according to the positional relationship between an edge of the clock signal CLK2 which is an input signal In1 and a corresponding edge of the clock signal CLK1 which is an input signal In2. The phase comparator 50 includes NAND circuits 51 to 55, inverters 56 to 60, and NOR circuits 61 and 62.

The NAND circuits 54 and 55 form a latch, and, in an initial state, two inputs are LOW and two outputs are HIGH. Moreover, the NOR circuits 61 and 62 form a latch, and, in an initial state, two inputs are LOW and an output DOUT is HIGH. When the rising edge of the signal In1 appears ahead of the rising edge of the signal In2, the output of the NAND circuit 52 becomes HIGH ahead of the output of the NAND circuit 53. Therefore, the output of the NAND circuit 54 becomes LOW, and the output of the NAND circuit 55 remains HIGH.

Since this state is latched, the state does not change even when the output of the NAND circuit 53 becomes HIGH thereafter by the rising edge of the signal In2, or the like. Thus, when the signal In1 has a phase lead, the output of the inverter 59 becomes HIGH. When the signal In2 has a phase lead, the output of the inverter 60 becomes HIGH. As a result, when the signal In1 has a phase lead, the output DOUT becomes LOW. When the signal In2 has a phase lead, the output DOUT remains HIGH.

A signal from the inverter 58 places the latch state of the NAND circuit in the initial state by driving the outputs of the NAND circuits 52 and 53 LOW concurrently at the right time. Unless such a configuration is adopted, when the signal In1 has a phase lead, after the output of the NAND circuit 52 becomes HIGH and then the output of the NAND circuit 53 becomes HIGH, the signal In1 returns to LOW ahead of the signal In2, whereby the latch state is reversed. To avoid this, the outputs of the NAND circuits 52 and 53 are driven LOW concurrently at the time when both the signal In1 and the signal In2 become LOW by the output from the inverter 58.

When the rising edge of the clock signal CLK2 appears first from a state in which the clock signals CLK1 and CLK2 are both LOW, the phase comparator 50 drives the output DOUT LOW. During the interval that the rising edge of the clock signal CLK2 continues to appear first, the output DOUT is maintained in a LOW state.

When the frequency of the clock signal CLK2 is higher than the frequency of the clock signal CLK1, the rising edge of the clock signal CLK2 gradually shifts forward with respect to the rising edge of the clock signal CLK1. When the rising edge of the clock signal CLK2 leads the rising edge of the clock signal CLK1 by 180° or more in phase, the state is changed from a state in which the clock signals CLK1 and CLK2 are both LOW to a state in which the rising edge of the clock signal CLK1 appears first. In this state, the output DOUT becomes HIGH, and, thereafter, a state in which the output DOUT is HIGH is maintained for some time.

When the rising edge of the clock signal CLK2 shifts further forward and leads the rising edge of the clock signal CLK1 by 360° or more in phase, the state is changed again into a state in which the rising edge of the clock signal CLK2 appears first. Therefore, the output DOUT becomes LOW, and, thereafter, a state in which the output DOUT is LOW is maintained for some time.

For example, when the frequency of the clock signal CLK2 is ahead of the frequency of the clock signal CLK1 by 1%, the output DOUT is HIGH for half the duration of 100 clock cycles, and the output DOUT is LOW for the other half. That is, the output DOUT becomes a pulse signal which becomes "1" once every 100 clock cycles. More generally speaking, the output DOUT becomes a signal having a pulse period (in this example, 100 cycles) according to a difference (in this example, 1%) between the frequency of the clock signal CLK1 and the frequency of the clock signal CLK2. Where the frequency difference is large, the pulse spacing of the output DOUT becomes small; and where the frequency difference is small, the pulse spacing of the output DOUT becomes large. In response to the repeated increase and decrease of the frequency of the clock signal CLK2, the pulse spacing of the output DOUT also increases and decreases repeatedly.

Figure 11:
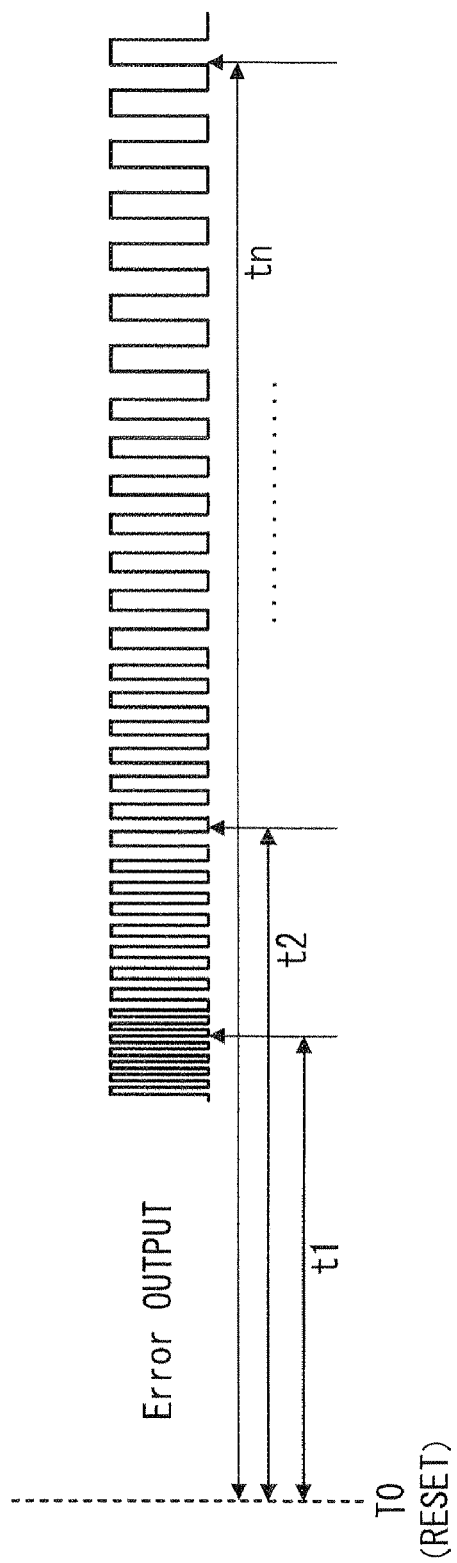
FIG. 11 is a diagram for explaining detection of an output of the test circuit by a logic tester.

FIG. 11 is a diagram for explaining detection of an output of the test circuit 12 by the logic tester 20. In FIG. 11, as an example, an Error output of the pattern checker 22 is depicted. At time T0, the pattern generator 21 and the pattern checker 22 are reset, and the frequency of the Error output is measured during predetermined time periods t1, t2, . . . , and tn after the reset. For example, to measure the frequency of the Error output during the time period tn, all that is needed is to count the number of pulses of the Error output in the logic tester 20 by a counter. By dividing the count value counted during the time period tn by tn, it is possible to measure the frequency of the Error output. Incidentally, although FIG. 11 illustrates an example in which the frequency of the Error output of the pattern checker 22 is measured, it is also possible to measure the frequency of the output DOUT of the phase comparator 50 in the same manner.

Moreover, in FIG. 11, the time periods t1, t2, . . . , and tn are time periods starting from time T0, having different lengths, and overlapping one another; however, t1, t2, . . . , and tn may be provided as time periods which do not overlap one another by making t2 start at the end of t1 and t3 start at the end of t2.

Figure 12:
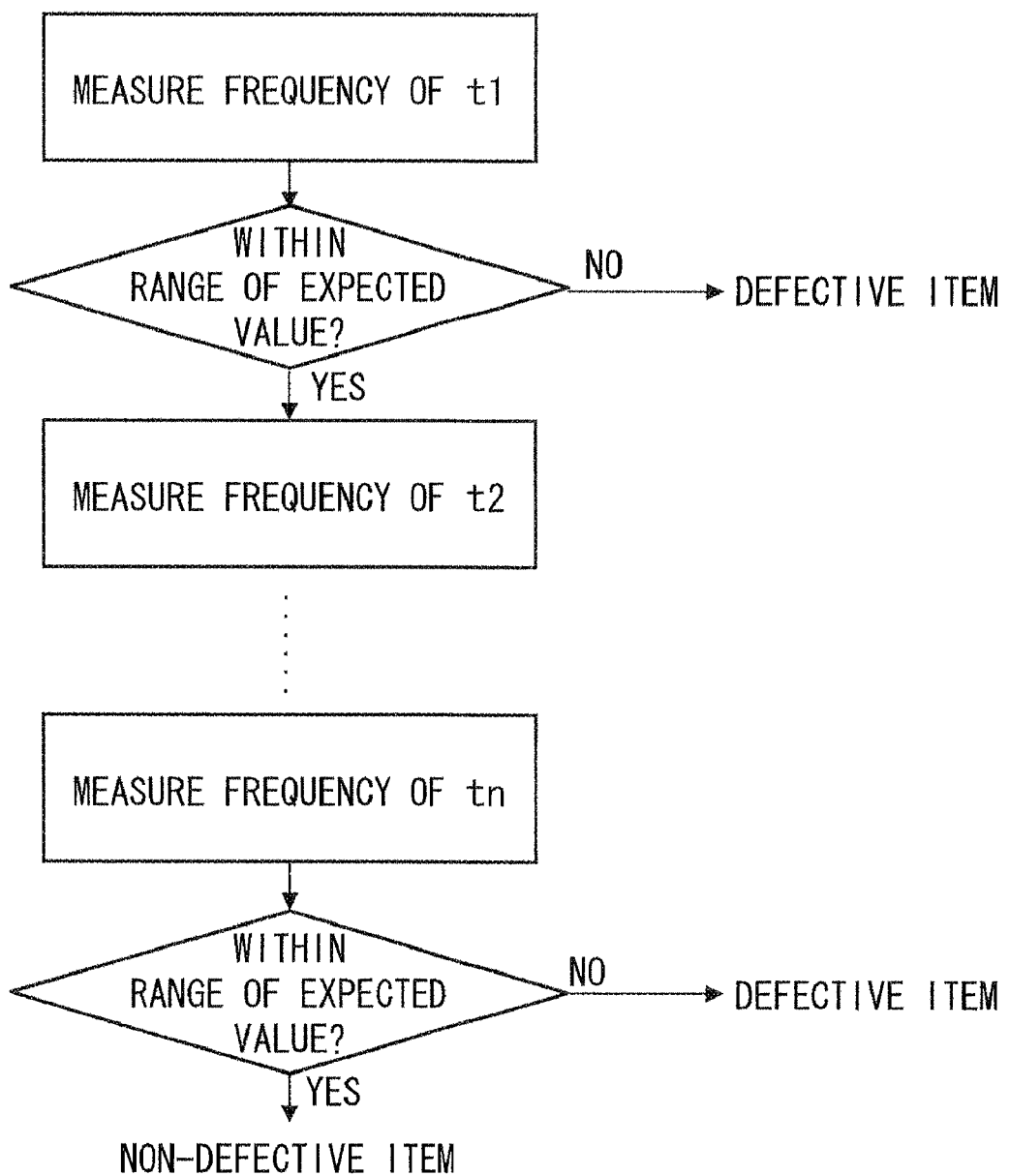
FIG. 12 is a diagram of an example of an algorithm for determining the quality by the logic tester based on an output of the test circuit.

FIG. 12 is a diagram of an example of an algorithm for determining the quality by the logic tester 20 based on an output of the test circuit 12. The algorithm of FIG. 12 for determining the quality measures, in a first step, the frequency of a signal (in an example of FIG. 11, an Error output) having a frequency to be measured during the time period t1.

In the next step, it is judged whether or not the measured frequency in the time period t1 is within the range of an expected value. If the frequency is found not to be within the range of an expected value, the spread spectrum clock generator 11 is judged to be a defective item. If the frequency is found to be within the range of an expected value, then the frequency of the signal having a frequency to be measured is measured during the time period t2 in the next step, and, as in the case with t1, it is judged whether or not the measured frequency is within the range of an expected value. The frequency is measured in the same manner during each time period, and it is judged whether or not the measured frequency is within the range of an expected value. When the measured frequency is found to be within the range of an expected value in all the time periods t1 to tn, the spread spectrum clock generator 11 is judged to be a non-defective item.

Figure 13:
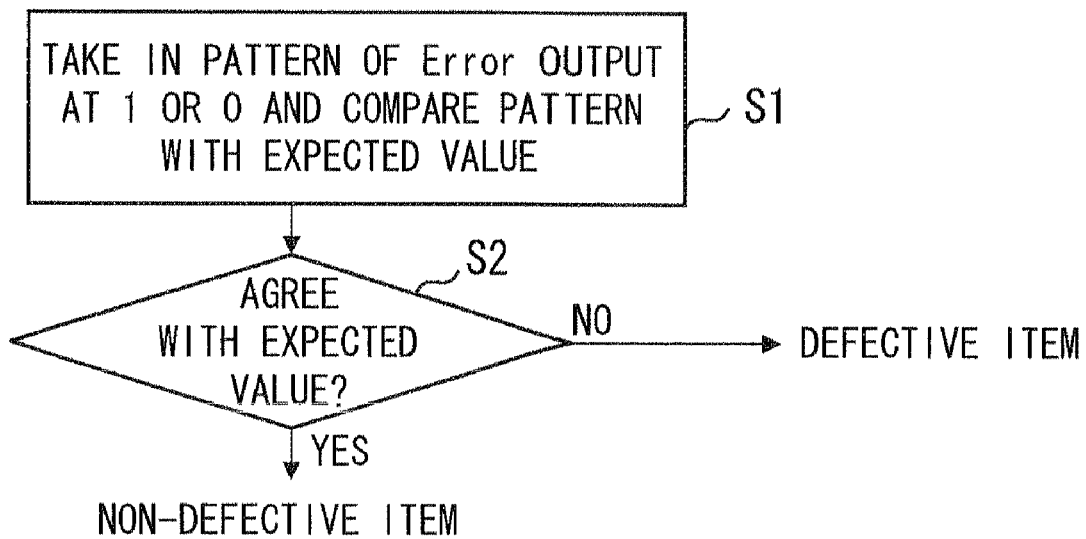
FIG. 13 is a diagram of another example of an algorithm for determining the quality by the logic tester based on an output of the test circuit.

FIG. 13 is a diagram of another example of an algorithm for determining the quality by the logic tester 20 based on an output of the test circuit 12. In the algorithm illustrated in FIG. 13, an Error output from the pattern checker 22 is detected by the logic tester 20 by using the clock signal CLK2 outputted from the semiconductor integrated circuit 10, for example, as a synchronizing signal. Specifically, in step S1, the Error output is taken in at the time at which the transition of the synchronizing signal to 1 or 0 takes place, and a value of the Error output thus taken in is compared with an expected value.

In step S2, it is judged whether or not the value of the Error output agrees with the expected value. If the value of the Error output is found to agree with the expected value, the spread spectrum clock generator 11 is judged to be a non-defective item; if the value of the Error output is found not to agree with the expected value, the spread spectrum clock generator 11 is judged to be a defective item.

Figure 14:
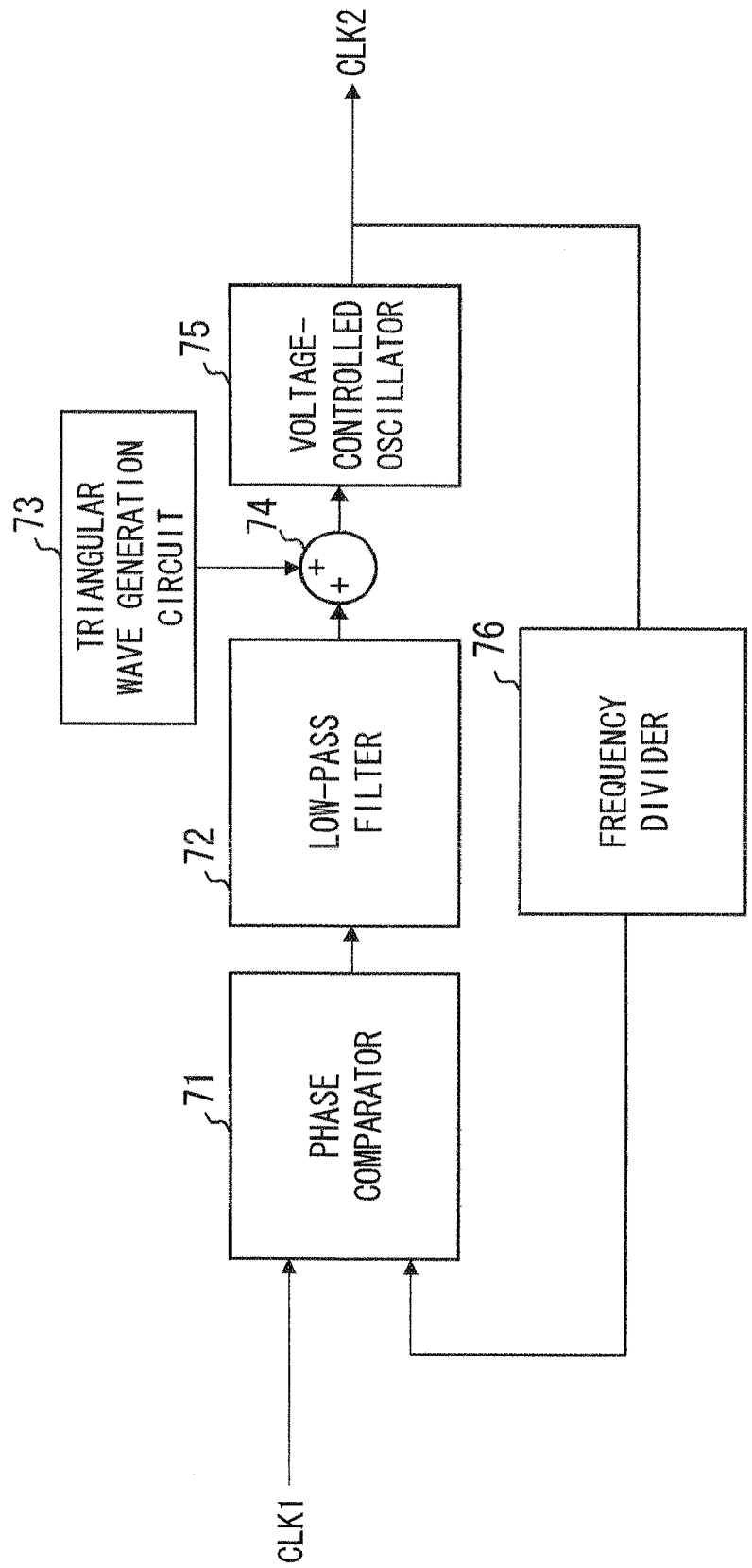
FIG. 14 is a diagram of an example of the configuration of a spread spectrum clock generator.

FIG. 14 is a diagram of an example of the configuration of a spread spectrum clock generator. The spread spectrum clock generator illustrated in FIG. 14 is a PLL-type clock generator, and generates a clock signal CLK2 using, as a reference frequency, a frequency obtained by multiplying the frequency of an input clock signal CLK1.

The spread spectrum clock generator of FIG. 14 includes a phase comparator 71, a low-pass filter 72, a triangular wave generation circuit 73, an adder 74, a voltage-controlled oscillator 75, and a frequency divider 76. The phase comparator 71 compares the timing of an edge of a signal obtained by subjecting the clock signal CLK2 to frequency division by the frequency divider 76 with the timing of an edge of the clock signal CLK1, and outputs a signal according to a phase difference between the edges. The low-pass filter 72 integrates the phase difference signal, thereby generating a DC voltage having a voltage according to the phase difference.

The voltage generated by the low-pass filter 72 and a triangular wave voltage generated by the triangular wave generation circuit 73 are added by the adder 74, and the voltage obtained by the addition is fed to the voltage-controlled oscillator 75. The voltage-controlled oscillator 75 generates a clock signal to be transmitted at a frequency according to the voltage thus fed. The signal generated by the voltage-controlled oscillator 75 becomes a clock signal CLK2. The clock signal CLK2 is subjected to frequency division by the frequency divider 76, and is fed to the phase comparator 71.

Based on this closed-loop feedback control, the clock signal CLK2 is generated having a frequency that varies, by using a frequency obtained by multiplying the frequency of the clock signal CLK1 as a reference frequency, in such a way as to deviate from the reference frequency by an amount according to the triangular wave voltage generated by the triangular wave generation circuit 73. Incidentally, in the configuration of FIG. 14, by removing the frequency divider 76 and connecting the feedback path from the voltage-controlled oscillator 75 directly to the phase comparator 71, it is possible to generate the clock signal CLK2 having a frequency fluctuating by using the frequency of the clock signal CLK1 as a reference frequency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor integrated circuit comprising:
a clock generator for generating a second clock signal having a frequency that varies over time by using, as an input, a first clock signal having a fixed frequency;
a test circuit for generating a digital signal according to a difference between a first frequency corresponding to the first clock signal and a second frequency corresponding to the second clock signal by a digital logic operation based on the first clock signal and the second clock signal; and
a signal path for outputting the digital signal generated by the test circuit.

2. The semiconductor integrated circuit according to claim 1,
wherein the test circuit generates, as the digital signal, a signal having a pulse spacing according to a difference between the first frequency and the second frequency.

3. The semiconductor integrated circuit according to claim 2,
wherein the test circuit further comprises:
a pattern generation circuit operating in synchronism with the first frequency and generating a bit sequence; and
a pattern detection circuit operating in synchronism with the second frequency and judging whether or not the bit sequence agrees with an expected value sequence.

4. The semiconductor integrated circuit according to claim 3, wherein
the pattern generation circuit is a pseudorandom bit sequence generator, and
the pattern detection circuit is a pseudorandom bit sequence detection circuit.

5. The semiconductor integrated circuit according to claim 2,
wherein the test circuit is a phase comparison circuit for comparing a phase of a signal of the first frequency with a phase of a signal of the second frequency.

6. The semiconductor integrated circuit according to claim 5,
wherein the phase comparison circuit outputs a signal having a signal level according to a positional relationship between an edge of a signal of the first frequency and a corresponding edge of a signal of the second frequency.

7. The semiconductor integrated circuit according to claim 1, further comprising:
a frequency divider for subjecting any one of the first clock signal and the second clock signal to frequency division,
wherein the test circuit generates the digital signal either by a digital logic operation based on the first clock signal and a signal obtained by subjecting the second clock signal to frequency division, or by a digital logic operation based on a signal obtained by subjecting the first clock signal to frequency division and the second clock signal.

8. The semiconductor integrated circuit according to claim 1,
wherein the clock generator generates the second clock signal as a signal having a frequency increasing and decreasing with a constant period with respect to a reference frequency.

9. A method for testing a semiconductor integrated circuit comprising: a clock generator for generating a second clock signal having a frequency that varies over time by using, as an input, a first clock signal having a fixed frequency; a test circuit for generating a digital signal according to a difference between a first frequency corresponding to the first clock signal and a second frequency corresponding to the second clock signal by a digital logic operation based on the first clock signal and the second clock signal; and a signal path for outputting the digital signal generated by the test circuit,
the method comprising the steps of:
measuring a period of a pulse of the digital signal;

comparing the measured period of the pulse with a predetermined period; and determining a quality of the clock generator based on a result of the comparison.

10. A method for testing a semiconductor integrated circuit comprising: a clock generator for generating a second clock signal having a frequency that varies over time by using, as an input, a first clock signal having a fixed frequency; a test circuit for generating a digital signal according to a difference between a first frequency corresponding to the first clock signal and a second frequency corresponding to the second clock signal by a digital logic operation based on the first clock signal and the second clock signal; and a signal path for outputting the digital signal generated by the test circuit, the method comprising the steps of:

detecting the digital signal in synchronism with either the first clock signal or the second clock signal;

comparing a result of the detection with an expected value; and determining a quality of the clock generator based on a result of the comparison.

* * * * *